(12) United States Patent
Liu et al.

(10) Patent No.: US 10,964,644 B2
(45) Date of Patent: Mar. 30, 2021

(54) ARRAY SUBSTRATE, CHIP ON FILM, AND ALIGNMENT METHOD

(71) Applicant: KunShan Go-Visionox Opto-Electronics Co., Ltd, Kunshan (CN)

(72) Inventors: Renjie Liu, Kunshan (CN); Xiangqian Wang, Kunshan (CN); Lingyan Chen, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/265,630

(22) Filed: Feb. 1, 2019

(65) Prior Publication Data

US 2019/0164901 A1 May 30, 2019

Related U.S. Application Data

(63) Continuation of application No. PCT/CN2018/102687, filed on Aug. 28, 2018.

(30) Foreign Application Priority Data

Apr. 2, 2018 (CN) .......................... 201810283325.3

(51) Int. Cl.
*H01L 23/544* (2006.01)
*H01L 25/00* (2006.01)
*H01L 27/12* (2006.01)

(52) U.S. Cl.
CPC ............ *H01L 23/544* (2013.01); *H01L 25/50* (2013.01); *H01L 27/124* (2013.01);
(Continued)

(58) Field of Classification Search
CPC .......... H01L 23/544; H01L 2224/0217; H01L 2224/10165; H01L 2224/81132;
(Continued)

(56) References Cited

U.S. PATENT DOCUMENTS

| 6,809,406 B2 | 10/2004 | Yoshiike et al. |
| 2003/0053056 A1 | 3/2003 | Ohazama |

(Continued)

FOREIGN PATENT DOCUMENTS

| CN | 1942052 A | 4/2007 |
| CN | 101060112 A | 10/2007 |

(Continued)

OTHER PUBLICATIONS

Chinese First Office Action dated Jun. 17, 2019 in CN Application No. 201810283325.3, Includes English Translation. 18 pages.

(Continued)

*Primary Examiner* — Alia Sabur

(57) ABSTRACT

Embodiments of the present application provide an array substrate, a chip on film and an alignment method. The array substrate includes a first pin correspondingly connected with a second pin on a chip on film; a first alignment mark located in a preset alignment range of the first pin and aligned with a second alignment mark on the chip on film; and a first offset mark located in the preset alignment range of the first pin, obtained according to the first alignment mark and the second alignment mark and configured to indicate an alignment deviation between the first pin and the second pin.

11 Claims, 10 Drawing Sheets

(52) U.S. Cl.
CPC .. *H01L 27/1218* (2013.01); *H01L 2223/5442* (2013.01); *H01L 2223/54406* (2013.01); *H01L 2223/54426* (2013.01); *H01L 2223/54433* (2013.01)

(58) Field of Classification Search
CPC .. H01L 2224/8013; H01L 2224/80121; G02B 6/4224; G03F 7/70683
See application file for complete search history.

(56) References Cited

U.S. PATENT DOCUMENTS

| | | | |
|---|---|---|---|
| 2014/0111729 | A1 | 4/2014 | Que et al. |
| 2018/0090442 | A1 | 3/2018 | Li et al. |
| 2018/0108636 | A1* | 4/2018 | Chen ................... G02F 1/1345 |

FOREIGN PATENT DOCUMENTS

| | | | |
|---|---|---|---|
| CN | 101271646 | A | 9/2008 |
| CN | 102890348 | A | 1/2013 |
| CN | 203365865 | U | 12/2013 |
| CN | 106299092 | A | 1/2017 |
| CN | 106783664 | A | 5/2017 |
| JP | 1999274670 | A | 10/1999 |
| JP | 2003258396 | A | 9/2003 |
| JP | 2006119321 | A | 5/2006 |
| JP | 2006245514 | A * | 9/2006 |
| JP | 2006245514 | A | 9/2006 |
| JP | 2012013719 | A | 1/2012 |
| TW | 200737377 | A | 10/2007 |
| TW | 200822303 | A | 5/2008 |
| TW | 200847317 | A | 12/2008 |

OTHER PUBLICATIONS

International Search Report of PCT/CN2018/102687 dated Jan. 8, 2019.
Written Opinion of PCT/CN2018/102687 dated Jan. 8, 2019.
European Search Report in European Application No. 18913777.1 dated Oct. 29, 2020.
Japanese Notice of Reasons for Refusal in Application No. 2020-501522 dated Jan. 5, 2021.

* cited by examiner

ARRAY SUBSTRATE, CHIP ON FILM, AND ALIGNMENT METHOD

CROSS-REFERENCE TO RELATED APPLICATIONS

This application is a continuation of International Application No. PCT/CN2018/102687 filed on Aug. 28, 2018, which claims priority to Chinese patent application No. 201810283325.3 filed on Apr. 2, 2018. Both applications are incorporated herein by reference in their entireties.

TECHNICAL FIELD

The present application relates to the field of display technologies, particularly an array substrate, a chip on film and an alignment method.

BACKGROUND

A flexible display device refers to a display device in which a display panel is capable of being bendable and deformable. As a new generation of display devices, the flexible display device, because of a plurality of advantages such as thinness and lightness, high contrast, fast response, wide angle of view, high brightness and full color, has a wide application prospect in mobile phones, Personal Digital Assistants (PDAs), digital cameras, car-mounted displays, notebook computers, wall-mounted televisions and the military fields.

A pin or a terminal or an electrode disposed on a Chip On Film (COF) of the flexible display device may be aligned with a pin on a screen. However, due to improvement of integration and an environmental factor such as temperature and humidity and so on, alignment accuracy between the existing COF and the screen is not high.

SUMMARY

In view of this, embodiments of the present application provide an array substrate, a chip on film and an alignment method in order to solve the problem that a pin on the array substrate and a pin on the COF cannot be accurately aligned in the prior art.

In order to achieve above purposes, in a first aspect, the array substrate according to an embodiment of the present application includes at least one first pin correspondingly connected with at least one second pin on a chip on film; a first alignment mark located in a preset alignment range of the first pin and aligned with a second alignment mark on the chip on film; and a first offset mark located in the preset alignment range of the first pin, obtained according to the first alignment mark, and an alignment deviation between the first pin and the second pin being indicated via the first offset mark.

Further, the at least one first pin includes a plurality of first pins, the at least one second pin includes a plurality of second pins, and the first offset mark is adjacent to the first pin nearest to the first alignment mark of the plurality of first pins.

Further, the plurality of first pins or straight lines along the plurality of first pins are intersected with each other.

Further, the first offset mark includes a first alignment scale; and the first alignment scale includes a lateral alignment scale and/or a longitudinal alignment scale.

Further, the first offset mark includes a first alignment label; and the first alignment label includes a first lateral alignment label and a first longitudinal alignment label corresponding to the first lateral alignment label.

In a second aspect, the chip on film according to the present application includes at least one second pin correspondingly connected with a first pin on an array substrate; a second alignment mark located in a preset alignment range of the second pin and aligned with a first alignment mark on the array substrate; and a second offset mark located in the preset alignment range of the second pin, obtained according to the first alignment mark and the second alignment mark and indicating an alignment deviation between the first pin and the second pin.

Further, the at least one first pin includes a plurality of first pins, the at least one second pin includes a plurality of second pins, and the second offset mark is adjacent to the second pin nearest to the second alignment mark of the plurality of second pins.

Further, the plurality of second pins or straight lines along the plurality of second pins are intersected with each other.

Further, the second offset mark includes a second alignment scale; and the second alignment scale includes a lateral alignment scale and/or a longitudinal alignment scale.

Further, the second offset mark includes a second alignment label; and the second alignment label includes a second lateral alignment label and a second longitudinal alignment label corresponding to the second lateral alignment label.

In a third aspect, the display device according to an embodiment of the present application includes the array substrate according to any of the above-mentioned embodiments and a chip on film. The chip on film includes a second pin, a second alignment mark and a second offset mark.

In a fourth aspect, the display device according to an embodiment of the present application includes the chip on film according to any of the above-mentioned embodiments and an array substrate. The array substrate includes a first pin, a first alignment mark and a first offset mark.

In a fifth aspect, the alignment method according to an embodiment of the present application includes following steps. Correspondingly connecting a first pin on a first device with a second pin on a second device; aligning a first alignment mark on the first device with a second alignment mark on the second device; obtaining a first offset mark according to the first alignment mark and the second alignment mark; indicating an alignment deviation between the first pin and the second pin with a first offset mark; and aligning the first device and the second device according to the alignment deviation.

Further, the first device is one of the array substrate and the chip on film, and the second device is the other one of the array substrate and the chip on film.

In the array substrate, the chip on film, the alignment method and the display device according to the embodiments of the present application, the alignment mark is set to align the pin on the array substrate and the pin on the chip on film, and the offset mark is also set to indicate the alignment deviation between the pin on the array substrate and the pin on the chip on film. In this way, the offset mark may be used to determine the alignment deviation after the alignment mark is used for an alignment operation, and then the offset mark may be used for an accurate alignment operation. By this way, even if a pin with a tilt angle is affected with thermal expansion during a preparation process, the accurate alignment operation may be achieved by combining the offset mark.

BRIEF DESCRIPTION OF DRAWINGS

In order to more clearly illustrate technical solutions in embodiments of the present application or prior art, a brief description of accompanying drawings used in the embodiments or the prior art will be given below. Obviously, the accompanying drawings in the following description are part of the embodiments of the present application, and other accompanying drawings may be obtained with those skilled in the art according to the accompanying drawings without any creative work.

DETAILED DESCRIPTION

In order to make purposes, technical schemes and advantages of embodiments of the present application clearer, the technical schemes in the embodiments of the present application will be clearly and completely described with reference to accompanying drawings in the embodiments of the present application. Obviously, described embodiments are part of the embodiments of the present application, and not all of them. According to the embodiments of the present application, all other embodiments acquired with those skilled in the art without creative work fall within a protection scope of the present application.

Figure 1:
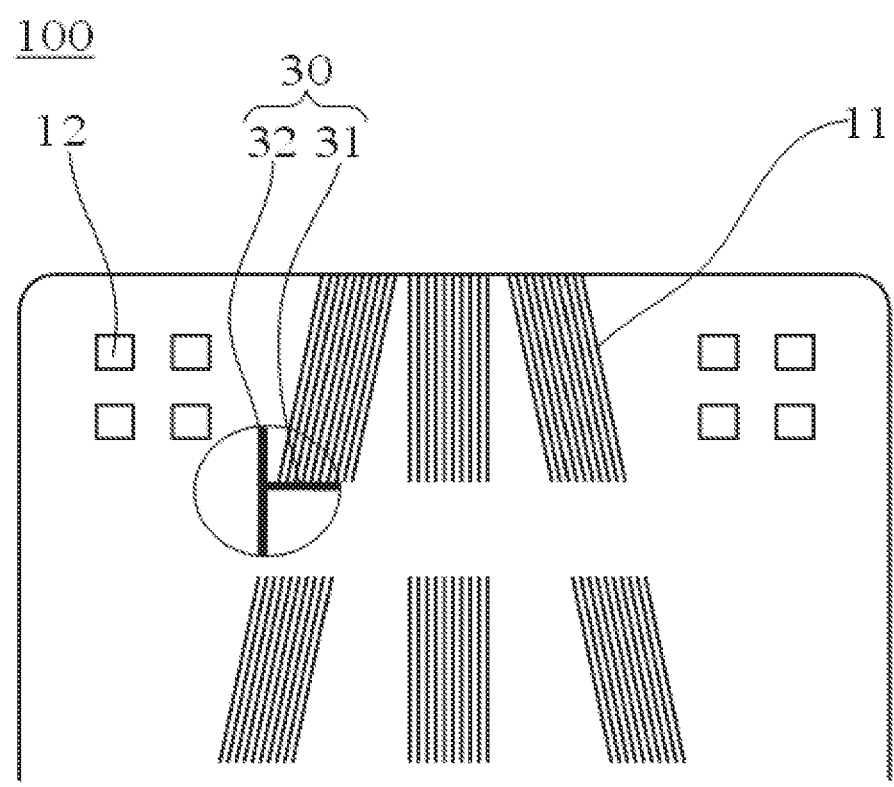
FIG. 1 is a schematic diagram of an array substrate according to an embodiment of the present application.
Figure 2:
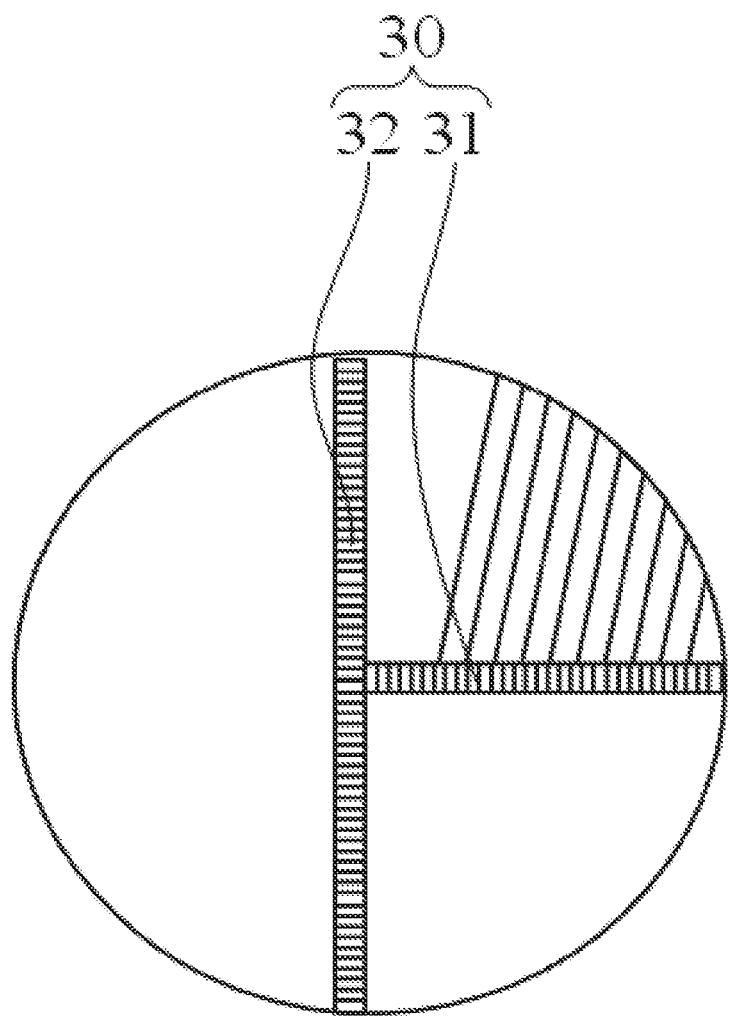
FIG. 2 is a partial enlarged schematic diagram of FIG. 1.
Figure 3:
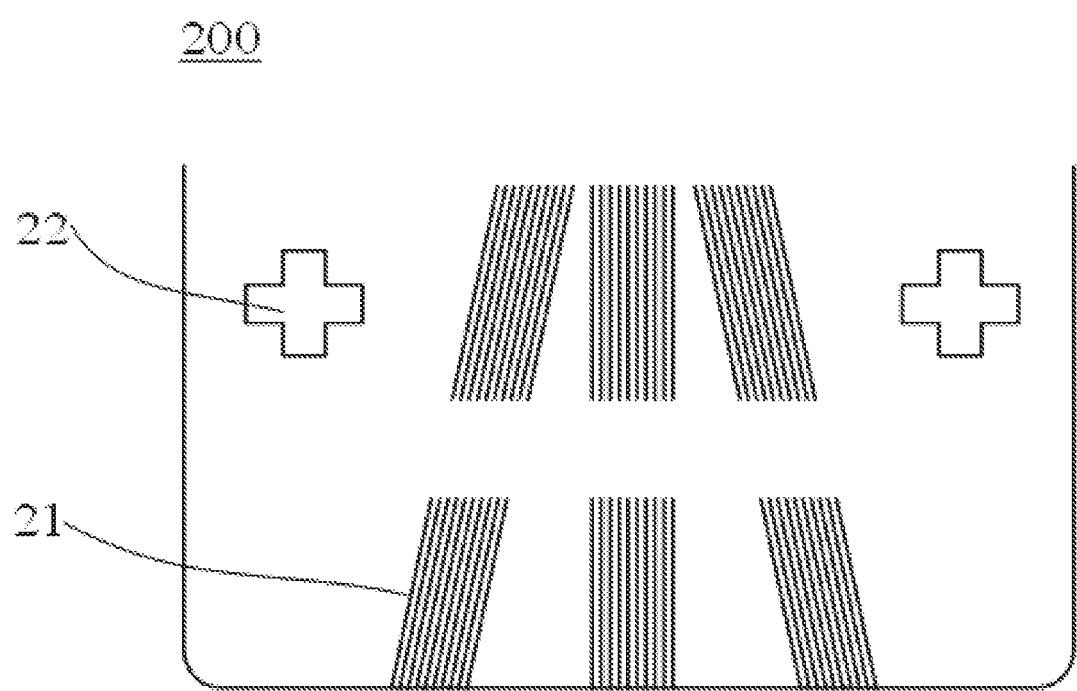
FIG. 3 is a schematic diagram of a chip on film according to an embodiment of the present application.

FIG. 1 is a schematic diagram of an array substrate according to an embodiment of the present application. FIG. 2 is a partial enlarged schematic diagram of FIG. 1. FIG. 3 is a schematic diagram of a chip on film according to an embodiment of the present application. A description will be made below with reference to FIGS. 1 to 3. It may be noted that the number and angles of pins shown in the figures are for illustration only, and are not intended to be limited in this application.

As shown in FIGS. 1 and 2, the array substrate 100 may include a plurality of pins 11, alignment marks 12, and at least a first alignment scale 30. As shown in FIG. 3, the chip on film 200 may include a plurality of pins 21 and alignment marks 22.

The array substrate 100 includes a display area and a non-display area. The non-display area includes a bonding area, and the plurality of pins 11 are disposed on the bonding area. The plurality of pins 11 are configured for one-to-one corresponding connections with the plurality of pins 21 on the chip on film 200. Similarly, the plurality of pins 21 are configured for the one-to-one corresponding connections with the plurality of pins 11 on the array substrate 100. The alignment marks 12 are disposed on at least one side of the plurality of pins 11, and the alignment marks 12 are aligned with the alignment marks 22 disposed on the chip on film 200. Similarly, the alignment marks 22 are disposed on at least one side of the plurality of pins 21, and the alignment marks 22 are aligned with the alignment marks 12 disposed on the array substrate 100.

The at least a first alignment scale 30 is disposed on at least one side of the plurality of pins 11 to indicate alignment deviations between the plurality of pins 11 and the plurality of pins 21.

When the plurality of pins 11 on the array substrate 100 are aligned with the plurality of pins 21 on the chip on film 200, the alignment marks 12 and the alignment marks 22 are aligned firstly. After the alignment marks 12 are coincided or paired with the alignment marks 22, an alignment operation is completed. Then the at least a first alignment scale 30 is used to determine the alignment deviations between the pins 11 and the pins 21 in a lateral direction or a longitudinal direction. According to the alignment deviations and the at least a first alignment scale 30, the array substrate 100 or the chip on film 200 is moved for an accurate alignment operation.

In an embodiment of the present application, the at least a first alignment scale 30 is adjacent to the pin 11 which is located on an outermost side of the plurality of pins 11. That is, the at least a first alignment scale 30 is adjacent to the pin 11 which is the nearest pin to the at least a first alignment scale 30 in the plurality of pins 11. As shown in FIG. 2, the at least a first alignment scale 30 is adjacent to the pin 11 which is located on a leftmost side of the plurality of pins 11.

In an embodiment of the present application, as shown in FIG. 2, the first alignment scale 30 includes a lateral alignment scale 31 and/or a longitudinal alignment scale 32.

After the alignment marks 12 and the alignment marks 22 are aligned, when an offset in the lateral direction between a pin 21 on an outermost side and the pin 11 on the outermost side is L, then when performing the accurate alignment operation, a moving distance D in the longitudinal direction equals to the product of L and tan A. At this time, the accurate alignment operation about the pins 11 and the pins 21 may be completed by moving the moving distance D by using the at least a first alignment scale 30 in the longitudinal direction. A is a tilt angle of the pin 11 on the outermost side relative to the lateral direction.

In an embodiment of the present application, the plurality of pins 11 are tilted. In other words, the plurality of pins 11 are not perpendicular to the lateral direction or the longitudinal direction and are not parallel to them. For example, the plurality of pins 11 or straight lines along the plurality of pins 11 are intersected with each other. For example, the tilt angles of the plurality of pins 11 relative to the lateral direction or the longitudinal direction are 30 degrees to 75 degrees. Preferably, the tilt angles are 45 degrees, 30 degrees, or 60 degrees. For example, each pin 11 may be set in parallel with each other. The pins 21 have a similar setting to the pins 11, and the embodiments of the present application will not be further described herein.

In an embodiment of the present application, the plurality of pins 11 are divided into three parts which include a left side part, a center position part and a right side part, and each part is consisted with at least one pin 11. The at least one pin 11 located on the left side part and the at least one pin 11 located on the right side part are tilted relative to the at least one pin 11 located on the center position part, and a tilt direction of the at least one pin 11 located on the left side part is opposite to that of the at least one pin 11 located on the right side part. For example, the at least one pin 11 located on the center position part is parallel to the longitudinal direction. Illustratively, as shown in FIG. 1, the at least one pin 11 located on the left side part tilts a first angle to the left relative to the at least one pin 11 located on the center position part, and the at least one pin 11 located on the right side part tilts a second angle to the right relative to the at least one pin 11 located on the center position part. For example, the first angle or the second angle may be any value from 30 degrees to 75 degrees. Preferably, the first angle or the second angle is 45 degrees, 30 degrees or 60 degrees. The pins 21 have a similar setting to the pins 11, and the embodiments of the present application will not be further described herein.

In an embodiment of the present application, shapes of the alignment marks 12 may be circle shapes, cross shapes, triangle shapes, trapezoid shapes, convex font shapes and so on. A shape of one of the alignment marks 22 is same or paired to the shape of the alignment mark 12 corresponding to the alignment mark 22. According to the shapes of the alignment marks 12, shapes of the alignment marks 22 may be circle shapes, cross shapes, triangle shapes, trapezoid shapes, convex font shapes and so on. As shown in FIG. 3, the shapes of the alignment marks 22 are cross shapes. As shown in FIG. 1, the shapes of the alignment marks 12 are paired with those of the alignment marks 22.

In an embodiment of the present application, one or more alignment marks 12 are located on at least one side of the plurality of pins 11. Preferably, central axes of all the alignment marks 12 are along a same straight line. Preferably, as shown in FIG. 1, the alignment marks 12 are disposed on two sides of the plurality of pins 11, and the alignment mark 12 on a side of the plurality of pins 11 is symmetrical to that on other side of the plurality of pins 11. Similarly, as shown in FIG. 3, the alignment marks 22 are disposed on two sides of the plurality of pins 21, and the alignment mark 22 on a side of the plurality of pins 21 is symmetrical to that on other side of the plurality of pins 21. The pins 21 have a similar setting to the pins 11, and the embodiments of the present application will not be further described herein.

In an embodiment of the present application, an area where the alignment marks 12 are located is set to be transparent, and an area where the first offset mark is located is set to be transparent.

Figure 4:
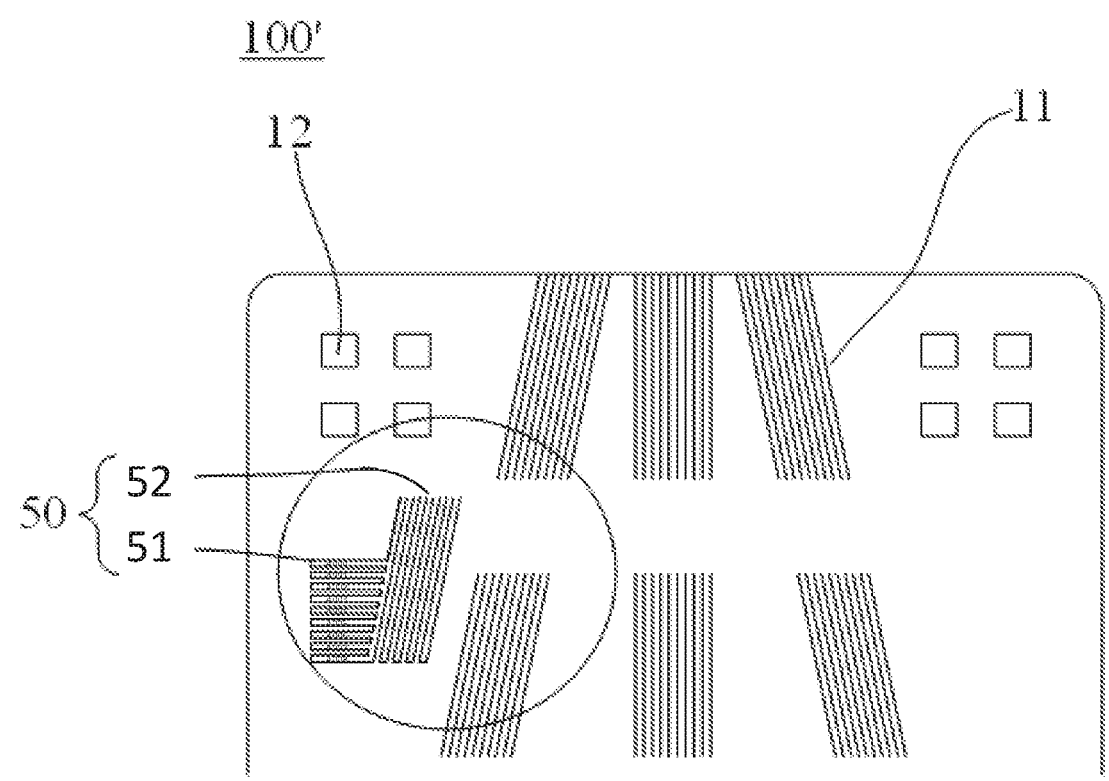
FIG. 4 is a schematic diagram of an array substrate according to another embodiment of the present application.
Figure 5:
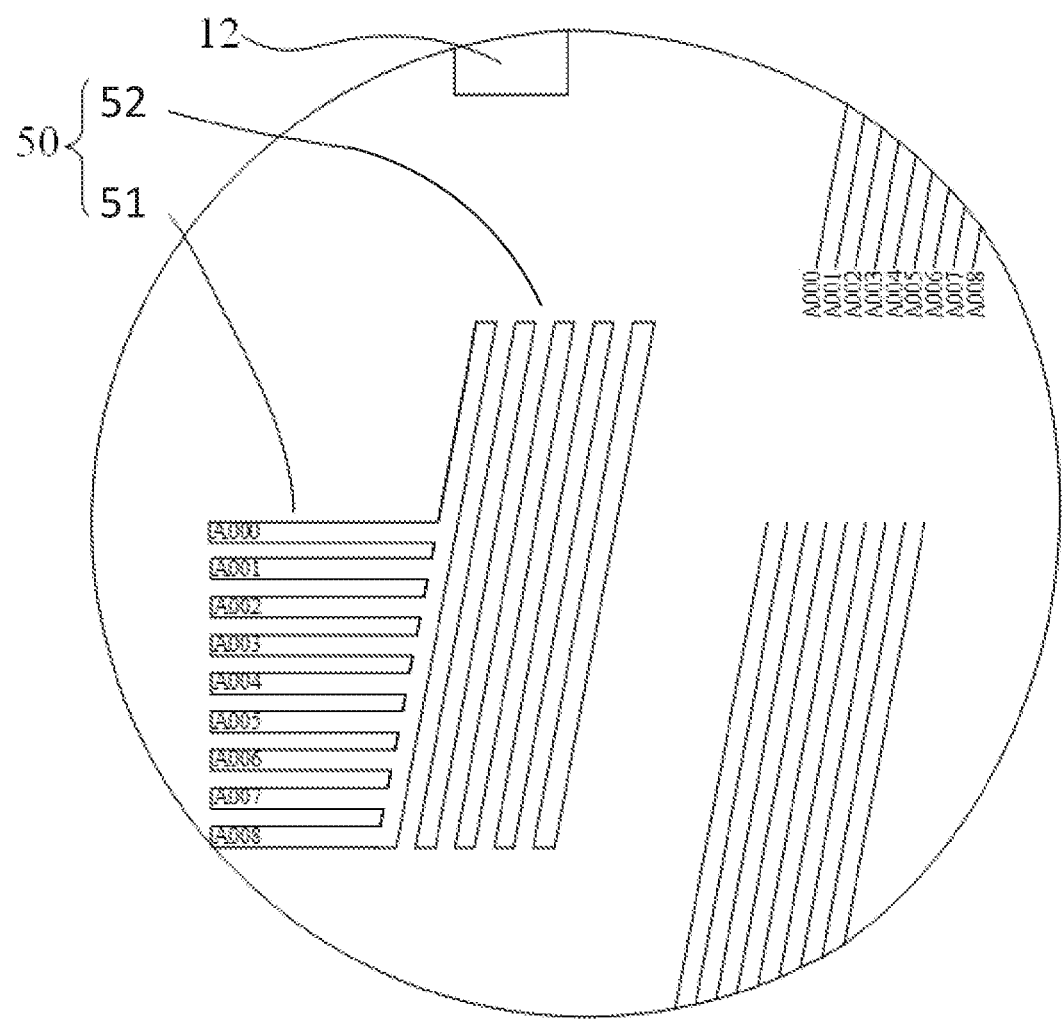
FIG. 5 is a partial enlarged schematic diagram of FIG. 4.

FIG. 4 is a schematic diagram of an array substrate according to another embodiment of the present application. FIG. 5 is a partial enlarged schematic diagram of FIG. 4. A difference between the array substrate 100' shown in FIG. 4 and the array substrate 100 mentioned according to above embodiments is that the first offset mark is a first alignment label 50. As shown in FIG. 4, the array substrate 100' may include a plurality of pins 11, alignment marks 12 and a first alignment label 50. As shown in FIGS. 4 and 5, the first alignment label 50 includes a plurality of first lateral alignment labels 51 and a plurality of first longitudinal alignment labels 52 corresponding to the plurality of first lateral alignment labels 51. For example, the first lateral alignment labels 51 include A000, A001 to A009, and the first longitudinal alignment labels 52 also include A000, A001 to A009 having one-to-one corresponding connections with the A000, A001 to A009 of the first lateral alignment labels 51. Setting positions of the first longitudinal alignment labels 52 are determined by setting positions of the first lateral alignment labels 51 and a value of A, a space between adjacent longitudinal alignment labels equals to the product of a space between adjacent lateral alignment labels and tan A, and A is a tilt angle of the pin 11 adjacent to the first lateral alignment labels 51 relative to a lateral direction. Thus, compared with the embodiments in which the offset mark is the alignment scale, after the alignment marks 12 and alignment marks 22 are coincided or paired, offsets between the pins 11 and the pins 21 in the lateral direction are determined according to the first lateral alignment labels 51, and then the pins 11 may be moved directly according to the first longitudinal alignment labels 52 in a longitudinal direction without calculating a moving distance in the longitudinal direction. For example, the pins 11 are shifted to A001 in the lateral direction, and then the pins 11 are correspondingly shifted to A001 in the longitudinal direction.

In an embodiment of the present application, the first lateral alignment labels 51 are adjacent to the pin 11 which is located on an outermost side of the plurality of pins 11. As shown in FIG. 4, the first lateral alignment labels 51 are adjacent to the pin 11 which is located on a leftmost side of the plurality of pins 11.

Embodiments of the present application provide a display device including the array substrate 100 and the chip on film 200 mentioned above, or the array substrate 100' and the chip on film 200 mentioned above.

Figure 6:
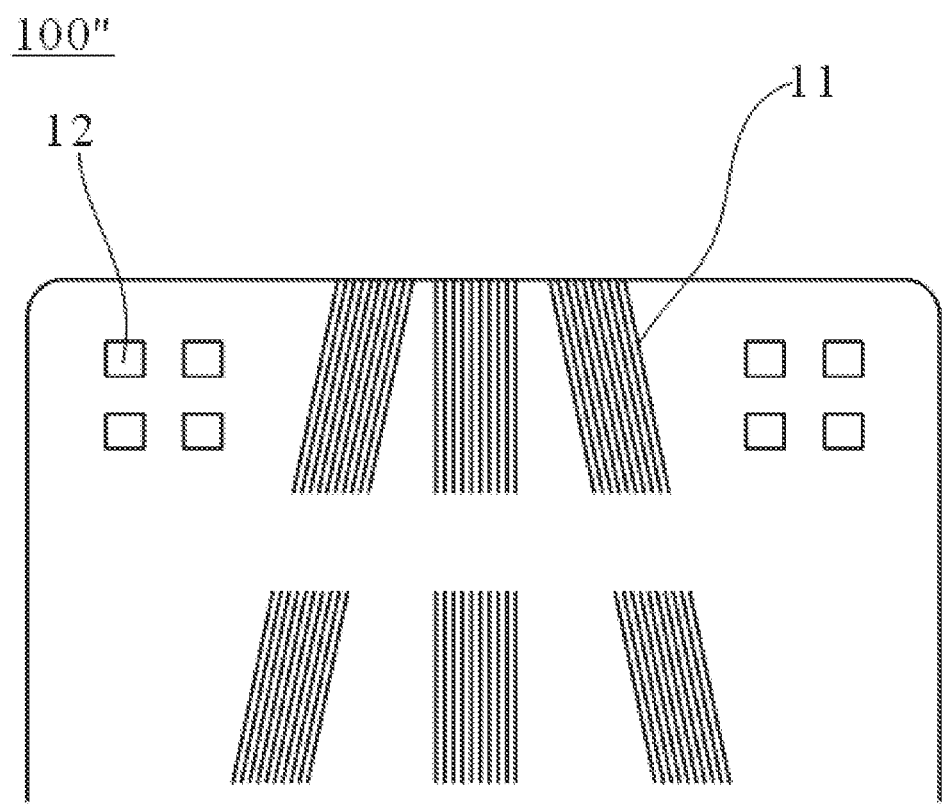
FIG. 6 is a schematic diagram of an array substrate according to still another embodiment of the present application.
Figure 7:
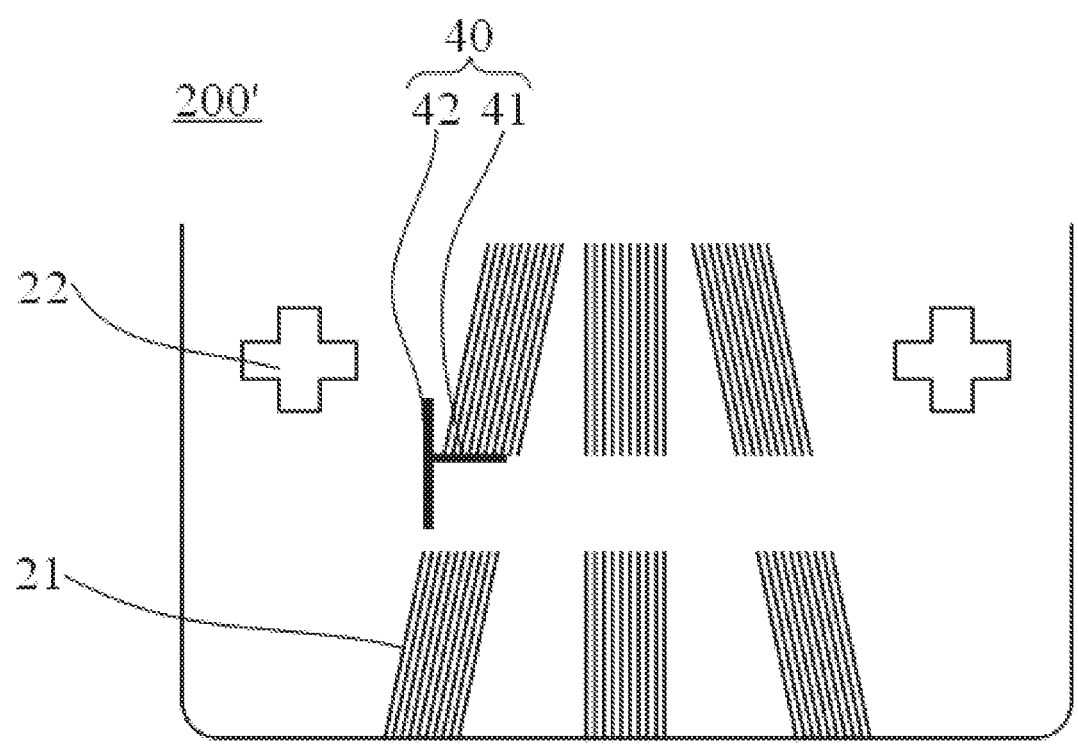
FIG. 7 is a schematic diagram of a chip on film according to still another embodiment of the present application.

FIG. 6 is a schematic diagram of an array substrate according to still another embodiment of the present application. FIG. 7 is a schematic diagram of a chip on film according to still another embodiment of the present application. A difference between the array substrate 100" shown in FIG. 6 and the array substrate 100 shown in FIG. 1 is that the array substrate 100" shown in FIG. 6 does not include the at least a first alignment scale 30. A difference between the chip on film 200' shown in FIG. 7 and the chip on film 200 shown in FIG. 3 is that the chip on film 200' shown in FIG. 7 includes at least a second alignment scale 40. That is, comparing with embodiments shown in FIGS. 1 and 3, the alignment scale is disposed on the chip on film instead of the array substrate in embodiments shown in FIGS. 6 and 7.

The at least a second alignment scale 40 is disposed on at least one side of a plurality of pins 21, and the at least a second alignment scale 40 is configured to indicate alignment deviations between a plurality of pins 11 and the plurality of pins 21.

In an embodiment of the present application, the at least a second alignment scale 40 is adjacent to the pin 21 which is located on an outermost side of the plurality of pins 21.

In an embodiment of the present application, the second alignment scale 40 includes a lateral alignment scale 41 and/or a longitudinal alignment scale 42.

A setting of the second alignment scale 40 is similar to that of the first alignment scale 30, and the embodiments of the present application will not be further described herein.

In an embodiment of the present application, an area where the alignment marks 22 are located is set to be transparent, and an area where the second offset mark is located is set to be transparent.

Figure 8:
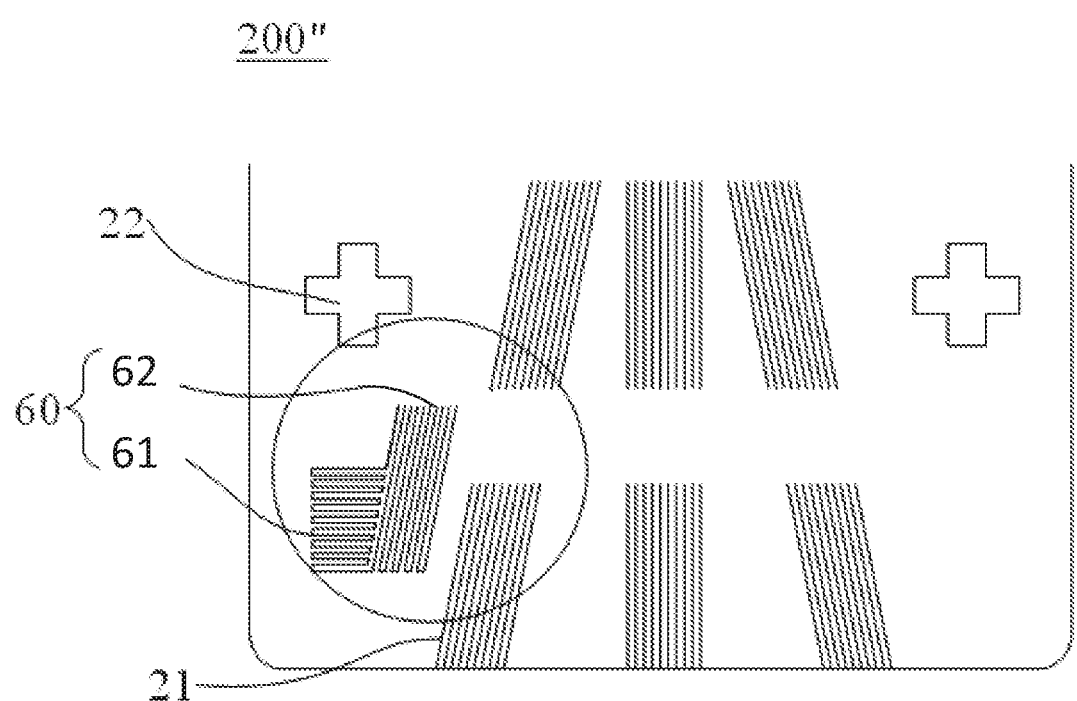
FIG. 8 is a schematic diagram of a chip on film according to yet still another embodiment of the present application.
Figure 9:
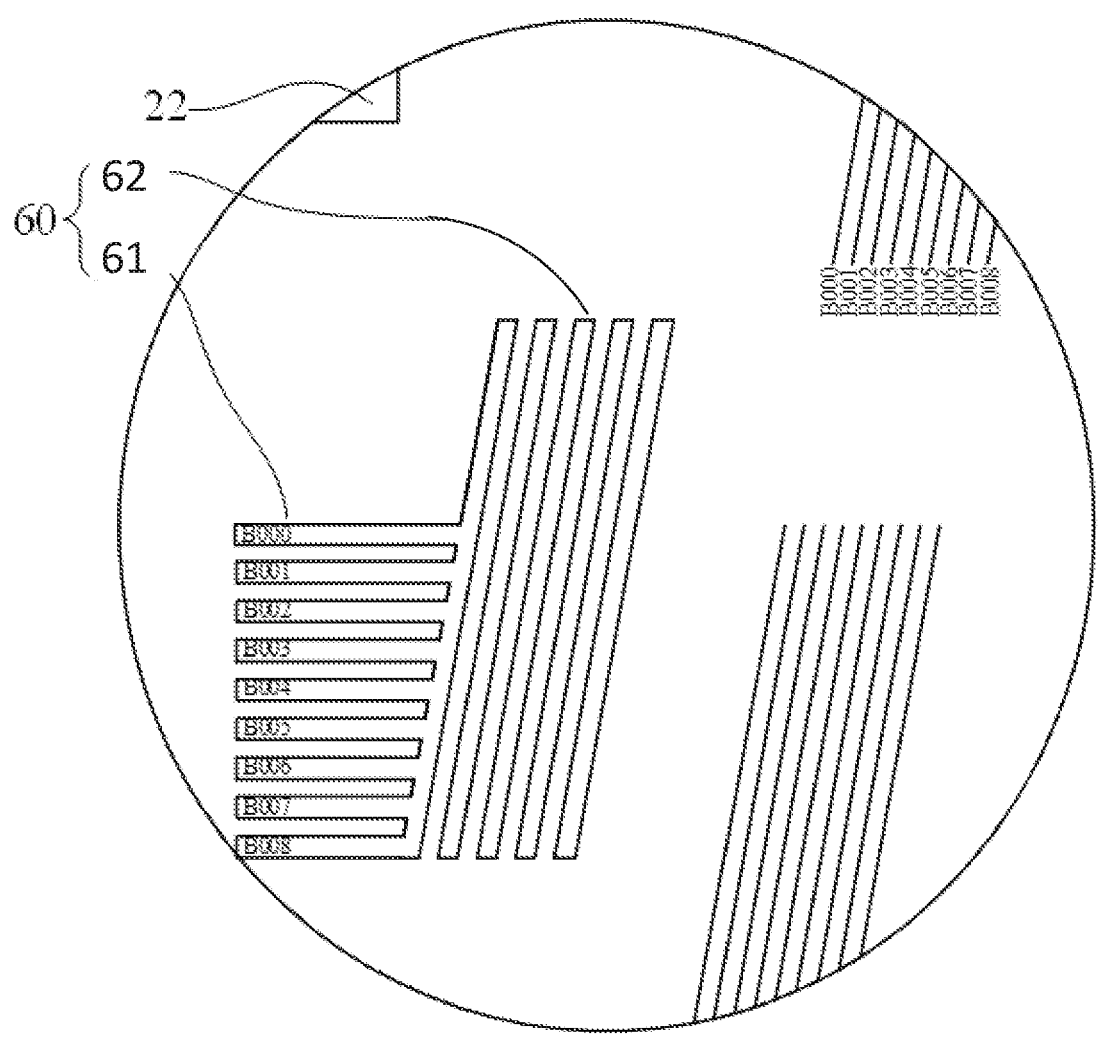
FIG. 9 is a partial enlarged schematic diagram of FIG. 8.

FIG. 8 is a schematic diagram of a chip on film according to yet still another embodiment of the present application. FIG. 9 is a partial enlarged schematic diagram of FIG. 8. A difference between the chip on film 200" shown in FIG. 8 and the chip on film 200' mentioned above is that a second offset mark is a second alignment label 60. As shown in FIG. 8, the chip on film 200" may include: a plurality of pins 21, alignment marks 22 and a second alignment label 60. As shown in FIGS. 8 and 9, the second alignment label 60 includes a plurality of second lateral alignment labels 61 and a plurality of second longitudinal alignment labels 62 having one-to-one corresponding connections with the plurality of second lateral alignment labels 61. For example, the second lateral alignment labels 61 include B000, B001 to B009, and the second longitudinal alignment labels 62 also include B000, B001 to B009 having one-to-one corresponding connections with the B000, B001 to B009 of the second lateral alignment labels 61. Setting positions of the second longitudinal alignment labels 62 are determined by setting positions of the second lateral alignment labels 61 and a value of A, a space between adjacent longitudinal alignment labels equals to the product of a space between adjacent lateral alignment labels and tan A, and A is a tilt angle of the pin 21 adjacent to the second lateral alignment labels 61 relative to a lateral direction. Thus, compared with the embodiments in which the offset mark is the alignment scale, after the alignment marks 12 and alignment marks 22 are coincided or paired, offsets between the pins 11 and the pins 21 in the lateral direction are determined according to the second lateral alignment labels 61, and then the pins 21 may be moved directly with the second longitudinal alignment labels 62 in a longitudinal direction without calculating a moving distance in the longitudinal direction. For example, the pins 21 are shifted to B001 in the lateral direction, and the pins 21 are correspondingly shifted to B001 in the longitudinal direction.

In an embodiment of the present application, the second lateral alignment labels 61 are adjacent to the pin 21 which is located on an outermost side of the plurality of pins 21. As shown in FIG. 8, the second lateral alignment labels 61 are adjacent to the pin 21 which is located on a leftmost side of the plurality of pins 21.

Embodiments of the present application provide a display device including the array substrate 100' and the chip on film 200' mentioned above, or the array substrate 100' and the chip on film 200" mentioned above.

An alignment method between an array substrate and a chip on film according to an embodiment of the present application includes following steps: setting at least one first pin on a first device, and the at least one first pin being correspondingly connected with at least one second pin disposed on a second device; setting a first alignment mark on the first device and the first alignment mark being aligned with a second alignment mark disposed on the second device; obtaining a first offset mark according to the first alignment mark and the second alignment mark, setting the first offset mark on the first device and indicating an alignment deviation between the at least one first pin and the at least one second pin according to the first offset mark; aligning the first device with the second device according to the alignment deviation. The first device is one of the array substrate and the chip on film, and the second device is the other of the array substrate and the chip on film.

In an embodiment of the present application, the setting a first alignment mark on the first device includes:
the first alignment mark is disposed on any side of the at least one first pin.

In an embodiment of the present application, the setting the first offset mark on the first device includes:
the first offset mark is disposed on at least one side of the at least one first pin.

Figure 10:
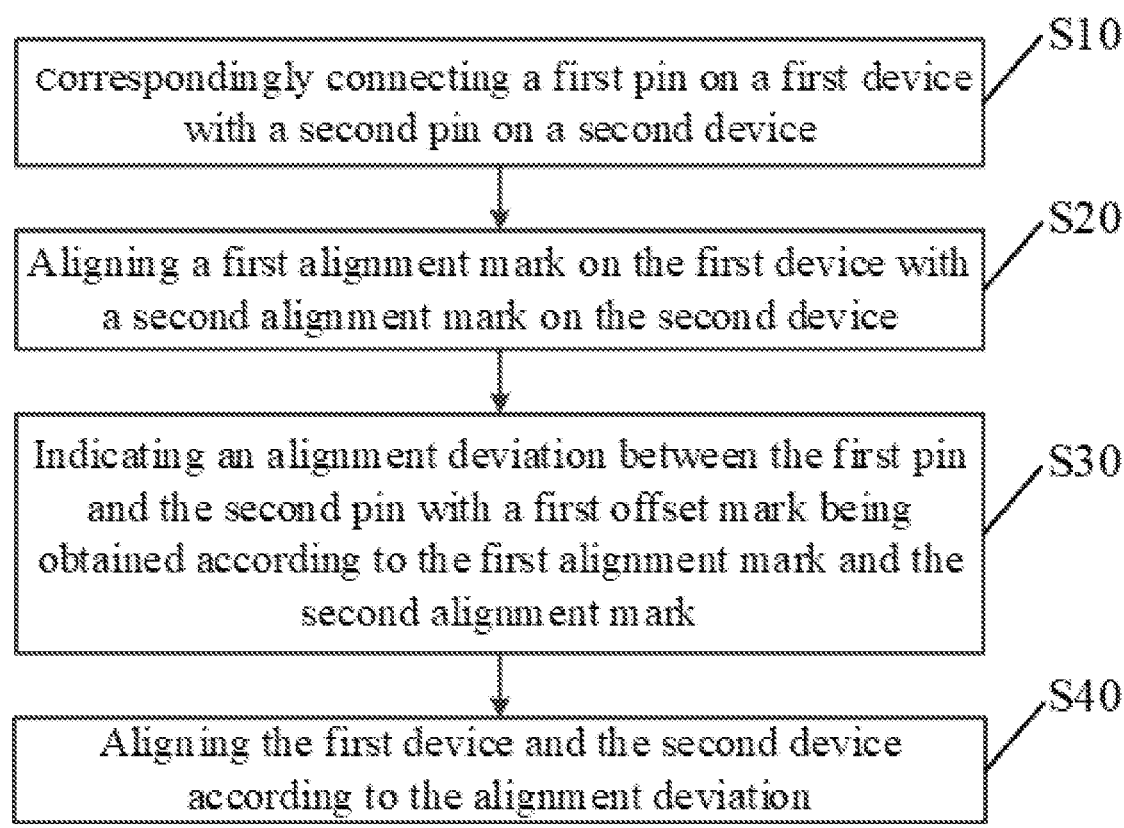
FIG. 10 is a schematic flowchart diagram of an alignment method according to an embodiment of the present application.

FIG. 10 is a schematic flowchart diagram of an alignment method according to an embodiment of the present application. As shown in FIG. 10, the alignment method according to the embodiment of the present application includes:

Step S10: correspondingly connecting a first pin on a first device with a second pin on a second device.

Step S20: aligning a first alignment mark on the first device with a second alignment mark on the second device.

Step S30: indicating an alignment deviation between the first pin and the second pin with a first offset mark being obtained according to the first alignment mark and the second alignment mark.

Step S40: aligning the first device and the second device according to the alignment deviation.

In other words, in the alignment method according to the embodiments of the present application, an accurate alignment operation between the first device and the second device is realized by means of the pins, the alignment marks and the offset mark.

An alignment method according to an embodiment of the present application will be described below with reference to the array substrate 100 and the chip on film 200 mentioned according to above embodiments of the present application. The alignment method includes following steps: setting at least one pin 11 on the array substrate 100 and the at least one pin 11 being correspondingly connected with at least one pin 21 disposed on the chip on film 200; setting at least one alignment mark 12 on at least one side of the at least one pin 11 and the at least one alignment mark 12 being aligned with at least one alignment mark 22 disposed on the chip on film 200; obtaining at least one first offset mark according to the at least one alignment mark 12 and the at least one alignment mark 22; setting the at least one first offset mark on at least one side of the at least one pin 11 and indicating an alignment deviation between the at least one pin 11 and the at least one pin 21 according to the at least one first offset mark; aligning the array substrate 100 and the chip on film 200 according to the alignment deviation. The array substrate 100 and the chip on film 200 are taken as an example here. It may be understood to those skilled in the art that the alignment methods mentioned above are also applicable to an array substrate and a chip on film described in other embodiments of the present application. For example, the array substrate 100' and the chip on film 200, or the array substrate 100' and the chip on film 200', or the array substrate 100' and the chip on film 200".

In the array substrate, the chip on film, the alignment method and the display device according to the embodiments of the present application, the alignment mark is set to align the pin on the array substrate and the pin on the chip on film, and the offset mark is also set to indicate the alignment deviation between the pin on the array substrate and the pin on the chip on film. In this way, the offset mark may be used to determine the alignment deviation after the alignment mark is used for an alignment operation, and then the offset mark may be used for an accurate alignment operation. By this way, even if the pin with a tilt angle is affected with thermal expansion during a preparation process, and an alignment method relying solely on the alignment mark is no longer effective, the accurate alignment operation may be achieved by combining the offset mark.

Finally, it may be noted that the above-mentioned embodiments are only used to explain the technical schemes of the present application, and are not limited thereto. Although the present application has been described in detail with reference to the above-mentioned embodiments, those skilled in the art may understand that the technical schemes described in the above-mentioned embodiments may be modified, or some of technical features may be equivalently replaced. Modifications and substitutions of the embodiments of present application do not depart from the spirit and the scope of the technical solutions in the embodiments of the present application.

What is claimed is:
1. An array substrate, comprising:
at least one first pin correspondingly connected with at least one second pin on a chip on film;

a first alignment mark located in a preset alignment range of the first pin and aligned with a second alignment mark on the chip on film; and a first offset mark located in the preset alignment range of the first pin, wherein an alignment deviation between the first pin and the second pin being indicated via the first offset mark, wherein the first offset mark comprises a first alignment label and a second alignment label, wherein the first alignment label comprises a first lateral alignment label and a first longitudinal alignment label and wherein the second alignment label comprises a second lateral alignment label and a second longitudinal alignment label, wherein the first longitudinal alignment label corresponds to the first lateral alignment label, and wherein a space between the first and the second longitudinal alignment labels is a product of a space between the first and the second lateral alignment labels and tangent of a tilt angle of the first longitudinal alignment label, wherein the tilt angle is an angle between the first lateral alignment label and the first longitudinal alignment label.

2. The array substrate of claim 1, wherein the at least one first pin comprises a plurality of first pins, the at least one second pin comprises a plurality of second pins, and the first offset mark is adjacent to the first pin nearest to the first alignment mark of the plurality of first pins.

3. The array substrate of claim 2, wherein the plurality of first pins are at the tilt angle with respect to the first lateral alignment label.

4. The array substrate of claim 1, wherein the first and the second lateral alignment labels are parallel to one another.

5. The array substrate of claim 1, wherein the first and the second longitudinal alignment labels are parallel to one another.

6. The array substrate of claim 1, wherein an angle between the second lateral alignment label and the second longitudinal alignment label is the tilt angle.

7. A chip on film, comprising:
at least one second pin correspondingly connected with at least one first pin on an array substrate;

a second alignment mark located in a preset alignment range of the second pin and aligned with a first alignment mark on the array substrate; and a second offset mark located in the preset alignment range of the second pin, wherein an alignment deviation between the first pin and the second pin being indicated via the second offset mark, wherein the second offset mark comprises a first alignment label and a second alignment label, wherein the first alignment label comprises a first lateral alignment label and a first longitudinal alignment label and wherein the second alignment label comprises a second lateral alignment label and a second longitudinal alignment label, wherein the first longitudinal alignment label corresponds to the first lateral alignment label, and wherein a space between the first and the second longitudinal alignment labels is a product of a space between the first and the second lateral alignment labels and tangent of a tilt angle of the first longitudinal alignment label, wherein the tilt angle is an angle between the first lateral alignment label and the first longitudinal alignment label.

8. The chip on film of claim 7, wherein the at least one first pin comprises a plurality of first pins, the at least one second pin comprises a plurality of second pins, and the second offset mark is adjacent to the second pin nearest to the second alignment mark of the plurality of second pins.

9. The chip on film of claim 8, wherein the plurality of second pins or straight lines along the plurality of second pins are intersected with each other.

10. An alignment method, comprising:
correspondingly connecting a first pin on a first device with a second pin on a second device;

aligning a first alignment mark on the first device with a second alignment mark on the second device, wherein the first alignment mark is located in a preset alignment range of the first pin and aligned with the second alignment mark on the second device;

determining a first offset mark based on the first alignment mark and the second alignment mark, wherein the first offset mark is located in a preset alignment range of the first pin, wherein the first offset mark comprises a first alignment label and a second alignment label, wherein the first alignment label comprises a first lateral alignment label and a first longitudinal alignment label and wherein the second alignment label comprises a second lateral alignment label and a second longitudinal alignment label, wherein the first longitudinal alignment label corresponds to the first lateral alignment label, and wherein a space between the first and the second longitudinal alignment labels is a product of a space between the first and the second lateral alignment labels and tangent of a tilt angle of the first longitudinal alignment label, wherein the tilt angle is an angle between the first lateral alignment label and the first longitudinal alignment label;

determining an alignment deviation between the first pin and the second pin via the first offset mark; and aligning the first device and the second device according to the alignment deviation.

11. The alignment method of claim 10, wherein the first device is one of an array substrate and a chip on film, and the second device is the other one of the array substrate and the chip on film.

* * * * *